United States Patent
Dang et al.

(10) Patent No.: US 9,560,736 B2
(45) Date of Patent: Jan. 31, 2017

(54) PRINTED CIRCUIT BOARD CLIP

(71) Applicant: Cisco Technology, Inc., San Jose, CA (US)

(72) Inventors: Long Dang, San Jose, CA (US); Don Nguyen, Santa Clara, CA (US); Michael Brooks, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/546,494

(22) Filed: Nov. 18, 2014

(65) Prior Publication Data
US 2016/0143125 A1 May 19, 2016

(51) Int. Cl.
*H05K 1/02* (2006.01)
*H05K 3/22* (2006.01)
(Continued)

(52) U.S. Cl.
CPC ............ *H05K 1/0203* (2013.01); *F16B 2/248* (2013.01); *H05K 1/0204* (2013.01); *H05K 3/22* (2013.01);
(Continued)

(58) Field of Classification Search
CPC ............... H01L 2023/4062; H01L 2023/4068; H01L 23/40; H01L 23/4006; H01L 23/4093; H01L 2023/4037; H01L 2023/4043; H01L 23/32; H01L 24/72; H01L 2924/00; H05K 1/0201; H05K 1/0203; H05K 1/0204; H05K 1/0209; H05K 1/0212; H05K 1/021; H05K 2201/066; H05K 1/05; H05K 1/184; H05K 2201/10393; H05K 7/2015; H05K 1/181; H05K 1/18; H05K 1/182; H05K 1/183; H05K 2201/09063; H05K 2201/09072; H05K 2201/10606; H05K 2201/10598; H05K 2201/105; H05K 2201/10386; F24J 2/52; A47G 19/10; A47G 29/093; A41F 15/02; A44B 9/06; F16G 11/00
(Continued)

(56) References Cited

U.S. PATENT DOCUMENTS 7,137,440 B2 * 11/2006 Hsu ..................... H01L 23/4093
                                                                165/80.3
7,321,493 B2 *  1/2008 Liang .................. H01L 23/4093
                                                                165/185

(Continued)

OTHER PUBLICATIONS

Image, Nov. 2010, vettrcorp.com.
Noctua NH-U12F FAQs, Accessed Oct. 17, 2014, Noctua.at.

*Primary Examiner* — Ishwarbhai B Patel
(74) *Attorney, Agent, or Firm* — Lempia Summerfield Katz LLC (57) ABSTRACT

In one embodiment, a printed circuit board has a hole. The hole has a longest extent on a surface of the printed circuit board. A clip is held in the hole by feet of prongs. The feet are extensions each having a length that is more than half the longest extent of the hole. A heat sink is held, in part, relative to the printed circuit board by the clip. A part of the heat sink contacts a loop of the clip and applies a force on the clip directed away from the printed circuit board. The feet of the clip on an opposite side of the printed circuit board than the heat sink hold the clip to the printed circuit board to counteract the force. The prongs are configured to offset the feet such that the extensions overlap with the lengths extending along the longest extent of the hole by less than a sum of the lengths of the feet and less than the longest extent for insertion through the hole.

12 Claims, 5 Drawing Sheets

(51) Int. Cl.
 *F16B 2/24* (2006.01)
 *H05K 1/18* (2006.01)
(52) U.S. Cl.
 CPC ......... *H05K 1/181* (2013.01); *H05K 2201/066* (2013.01); *H05K 2201/10393* (2013.01)
(58) Field of Classification Search
 USPC ............... 174/250–268, 16.1, 16.3; 361/760, 361/704–720; 248/500, 505, 509, 510; 257/718, 257/719, 726, 727; 24/359, 366, 368, 369–373, 24/455, 457, 458, 461, 466, 470, 472, 570
 See application file for complete search history.

(56) References Cited

U.S. PATENT DOCUMENTS

| | | | |
|---|---|---|---|
| 8,482,923 B2 | 7/2013 | Tan et al. | |
| 2005/0246997 A1* | 11/2005 | Bishop | E04F 15/02 52/522 |
| 2007/0292229 A1* | 12/2007 | Andrew | E04B 9/18 410/101 |

* cited by examiner

PRINTED CIRCUIT BOARD CLIP

TECHNICAL FIELD

This disclosure relates in general to a clip, and more particularly to a clip for holding components to a printed circuit board.

BACKGROUND

Printed circuit boards support various electronics and are sized in such a way that there is limited space. The internal printed circuit board circuit trace routing design, to meet high speeds and other critical requirements, is heavily impacted by three-dimensional or other features, such holes or slots. To mount heat sinks or other components, holes or slots are provided. Heat sinks or other components require screws, clips or other hardware for mounting. The holes to support the mounting parts use valuable circuit routing areas in the most critical areas adjacent to high density semiconductors requiring extensive traces. The mounting holes or slots may limit the electronics or features that can be incorporated into a printed circuit board of a fixed size. The holes or slots may also impact integrity of the printed circuit board by causing structural weakness.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts.

DESCRIPTION OF EXAMPLE EMBODIMENTS

Overview

A clip for holding a component to a printed circuit board is designed to use smaller holes for insertion. The legs of the clip are offset so that the retaining prongs slide beside instead of blocking each other. This allows the retaining prongs to align for insertion through the smaller hole.

In one aspect, a system includes a printed circuit board having a hole. The hole has a longest extent on a surface of the printed circuit board. A clip is held in the hole by feet of prongs. The feet are extensions each having a length that is more than half the longest extent of the hole. A heat sink is held, in part, relative to the printed circuit board by the clip. A part of the heat sink contacts a loop of the clip and applies a force on the clip directed away from the printed circuit board. The feet of the clip on an opposite side of the printed circuit board than the heat sink hold the clip to the printed circuit board to counteract the force. The prongs are configured to offset the feet such that the extensions overlap with the lengths extending along the longest extent of the hole by less than a sum of the lengths of the feet and less than the longest extent for insertion through the hole.

In a second aspect, a method includes compressing a hook clip such that legs of the hook clip approach each other along paths of travel that are side-by-side without blocking each other. In response to the compressing, retaining parts of the legs are aligned side-by-side along the paths of travel. The method includes inserting the retaining parts through a hole in a board and releasing the compression so that the retaining parts move along the paths of travel away from each other. Withdraw of the hook clip from the hole in the board is prevented by the retaining parts.

In a third aspect, an apparatus includes a body having a hook gap. The body and the hook gap are in a plane. Prongs extend from the body. At least part of one of the prongs is positioned out of the plane. Retainers extend from the prongs and are parallel to the plane. The retainers are positionable adjacent to each other with overlap as viewed along a direction perpendicular to the plane and intersecting the retainers.

Example Embodiments

The hook clip for the heat sink or other component may reduce the space required for a mounting hole in the printed circuit board by about 50% (e.g., by 40-49%). An associated benefit includes reduced restrictions on printed circuit board routing, possibly improving performance and potential feature sets. Cost may be reduced and manufacturing may be easier than for other printed circuit board clip mounts. In high volume production, the clip with the offset prongs and retainers may enable an automated vacuum installation, reducing assembly time, increasing throughput, and reducing assembly costs.

Figure 1:
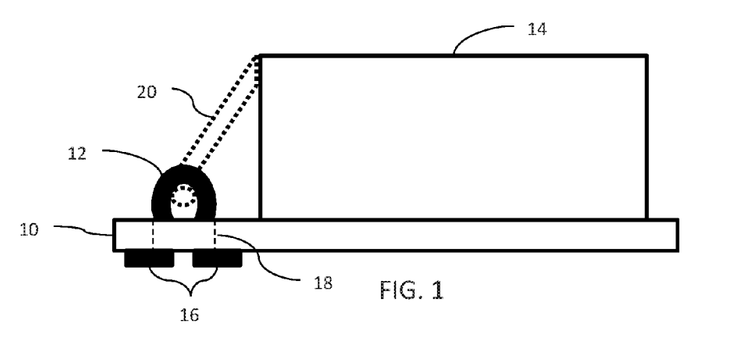
FIG. 1 is a cross-sectional side view of one embodiment of a system for mounting a heat sink to a printed circuit board.

FIG. 1 shows a system for mounting a heat sink 14 to a printed circuit board 10. The printed circuit board 10 includes one or more processors, chips, semiconductors, circuits, or other heat generating components. The heat sink 14 fits on, against or by one or more of the heat generating components for cooling. For example, the heat generating chip is sandwiched between the printed circuit board 10 and the heat sink 14. FIG. 1 shows the system in an assembled configuration. In other embodiments, the heat sink 14 and/or the clip 12 are not connected with the printed circuit board 10.

Additional, different, or fewer components may be provided. In other embodiments, a different component than a heat sink 14 is mounted to the printed circuit board 10. For example, a connector, jack, port, transformer, housing, or other component is mounted. In yet other embodiments, a different substrate than a printed circuit board is used. While only one clip 12 is shown, other clips or different mounting structures may be provided for holding or mounting the heat sink 14. For example, two, three, four or more clips 12 are provided adjacent to the heat sink 14 on the printed circuit board 10. The clips 12 are on different sides and/or corners, but may share a same side of the heat sink 14.

The printed circuit board 10 is any now known or later developed circuit board for electronics. The printed circuit board 10 is a laminate of different layers of thermoset resin with cloth or paper. Other materials may be used. Any number of layers may be provided. The printed circuit board 10 is single sided, double sided, or multi-layer.

The printed circuit board 10 provides a dielectric material in and/or on which copper or other conductive traces are provided. The traces and pads for connecting with electrical components are embedded within or deposited on the printed circuit board 10. Etching, deposition, bonding, or other processes are used to provide the traces, pads, or embedded components (e.g., capacitors, resistors, or active devices). Vias may be provided for routing traces through layers.

The printed circuit board 10 includes one or more active devices (e.g., transistors, chips, processor, circuits, application specific integrated circuits, field programmable gate arrays, and/or memories) and/or one or more passive devices (e.g., capacitors, resistors, inductors, connectors, vias, or pads). The active and/or passive devices are on one or two sides (e.g., large surfaces) of the printed circuit board 10.

The printed circuit board 10 has traces, pads, and electronics (e.g., active or passive devices) arranged for any purpose. In one embodiment, the printed circuit board 10 is a network server card. Alternatively, the printed circuit board 10 is a graphics card, motherboard, device card (e.g., Ethernet card), router, switch, or other electronics part of a computer, router, switch, or server. Any computer, server, network, or other processing may be provided by the printed circuit board 10.

One or more holes 18 are provided through the printed circuit board 10. The holes 18 are provided for inserting the clips 12 to hold the heat sink 14. The holes 18 are etched, drilled, sawed, cut, or otherwise formed in the substrate of the printed circuit board 10. The holes 18 may be bare. Alternatively, the holes 18 are plated or include an insert. The insert may be metal, plastic, or other material for structural reinforcement or other purpose.

The holes 18 are oblong or rectangular. In other embodiments, the holes 18 are elliptical, circular, or have two rectangles offset from each other but still connected (see FIG. 4). Other shapes may be provided. The holes 18 extend completely through the printed circuit board 10, such as extending from one surface through to another surface. In other embodiments, the holes are through some but not all layers, such as being through multiple layers to a cavity formed within the printed circuit board 10.

Figure 2A:
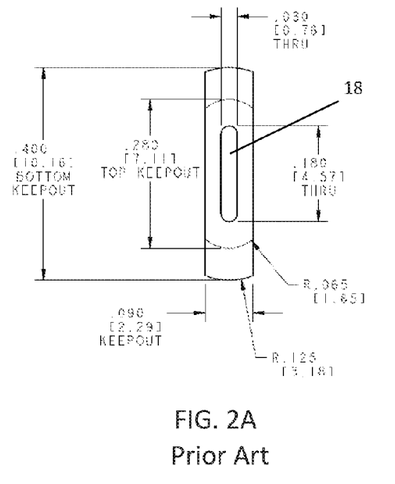
FIG. 2A is an example hole configuration in a printed circuit board.
Figure 2B:
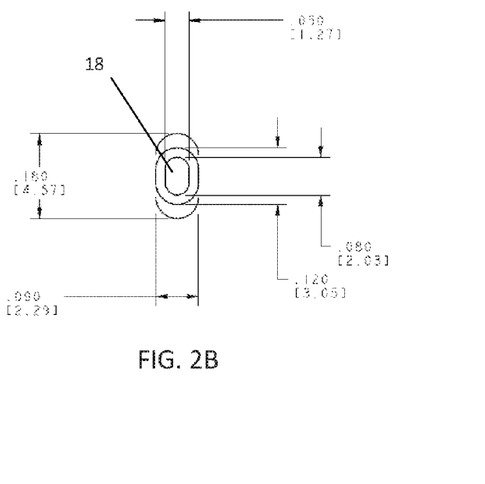
FIG. 2B is another example of a smaller hole configuration.

FIGS. 2A and 2B show two example holes 18 and dimensions. The dimensions are given as examples. Other dimensions in length and/or width may be used.

The hole 18 of FIG. 2A is larger. The inner region shown as 0.180 inches in length is the hole. The 0.280 inch length region designates a plated area or insert for structural support. The largest area shown as 0.400 inches in length is a "keep out" area where traces or other electrical components are not provided in or on the printed circuit board 10. If a spring clip formed in a plane where to be compressed so that the retainers at the bottom touched (i.e., the prongs touch), the retainers could each be a little less than 0.090 (e.g., 0.050) in length to fit through the 0.180 hole.

FIG. 2B shows a smaller hole 18. The hole 18 has a longest extent on the surface and through the printed circuit board shown as 0.080. With the 0.050 inch long retainers contacting each other for a 0.100 inch length, the clip 12 would not be insertable through this smaller hole. This smaller hole 18 has a longest extent of less than 0.090 inches in one embodiment, but may have a longer or shorter longest extent.

FIG. 2A shows an example width of the hole 18 as 0.030 inches as compared with the width of the hole 18 of FIG. 2B as 0.050 inches. The larger width of the hole of FIG. 2B may have space for a larger part in width, such as two 0.020 inch parts next to each other (e.g., sum of 0.040), to pass through. Whereas, these two parts adjacent each other along the width dimension could not pass through the 0.030 inch width of the hole 18 of FIG. 2A. The width is shown as perpendicular to the longest extent (e.g., length).

The hole of FIG. 2A is a conventional hole for a conventional clip. The hole of FIG. 2B is a smaller hole for use with the clip 12 described herein. The hook clip 12 is designed to mount heat sinks 14 using very small holes in the printed circuit board 10 to reduce space on the surface and interior of the printed circuit board 10. The smaller hole 18 of FIG. 2B may reduce the footprint of the hole 18 and corresponding insert/keep out region by up to about 50% (e.g., by 30-45%) in length.

Figure 3:
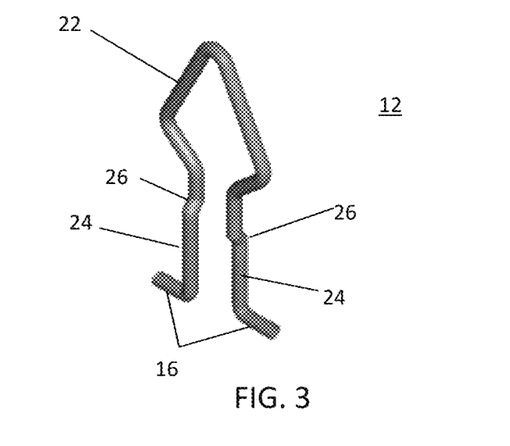
FIG. 3 is a perspective view of one embodiment of a clip.

FIG. 3 shows the clip 12. The clip 12 is an apparatus of one part or is made of connected parts. The clip 12 is one unitary part of the same material. In one embodiment, the clip 12 is spring steel, but plastic or other spring material may be used. In other embodiments, different materials are bonded, laminated, sintered, or connected together.

Figure 4:
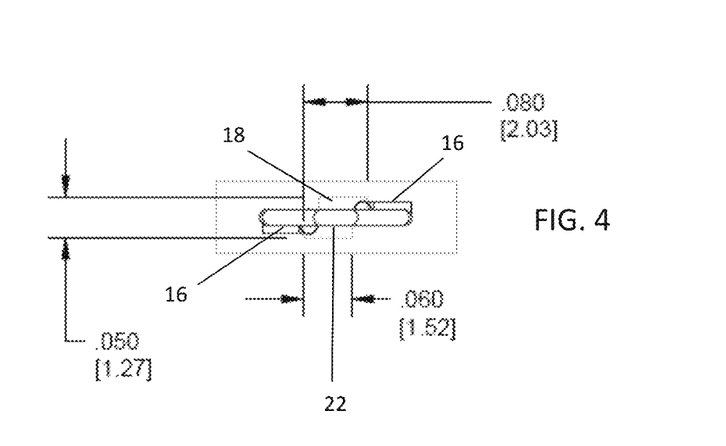
FIG. 4 is a top view of the clip of FIG. 3 as inserted in a hole.

The clip 12 can have any diameter. The diameter is uniform along most or all of the clip 12. Alternatively, the different cross sections of the clip 12 have different diameters and/or cross section shapes (e.g., see FIG. 7). The diameter may determine the dimensions of the hole 18 or slot. In the example of FIG. 4, the clip 12 has a 0.6 mm diameter for a 0.05×0.08 hole 18 of FIG. 2B. In another example, the holes 18 is 0.045×0.075 for a 0.5 mm wire.

The clip 12 includes a body 22, prongs or legs 24, and extensions or feet 16. Additional, different, or fewer components may be provided. For example, the extensions 16 may extend from higher up or not from the end of the prongs 24. The extensions 16 are shown as the terminating ends of the clip 12, but may be formed from bends in the prongs 24 without including the terminating ends. The clip 12 may be a continuously connected loop with bends formed for provide the body 22, prongs 24 and extensions 16.

Figure 7:
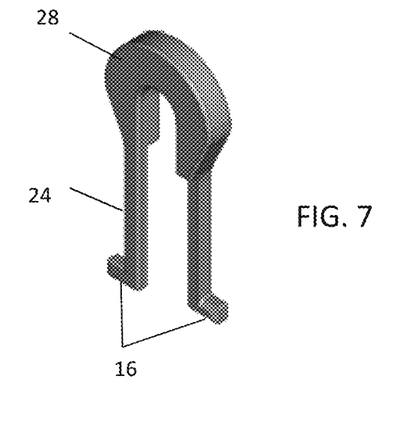
FIGS. 7 and 8 are a perspective and a side view, respectively, of another embodiment of a clip.
Figure 8:
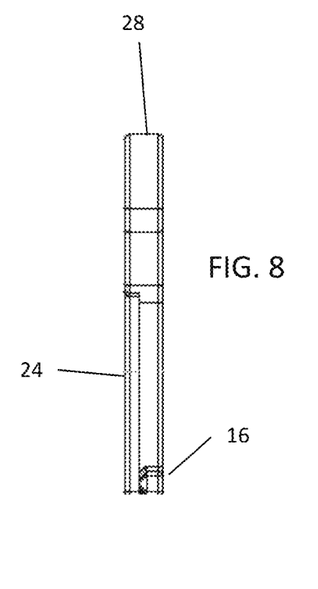

The clip 12 has the body 22 forming a loop structure. The loop of the body 22 has any shape, such as the generally triangular shape shown in FIG. 3. Square, rectangular, oblong, circular or other shapes may form a gap through which a hook may be inserted. Any body 22 with uniform or non-uniform distribution of material may be provided. FIGS. 7 and 8 show an example of a different body 28 formed of plastic or stamped/coined metal.

In other embodiments, a plastic cover is provided. For example, the different body 28 of FIGS. 7 and 8 is a plastic cover fit over a spring material forming an interior of the body 28, the prongs 24, and the extensions 16.

The stamped/coined or plastic cover body 28 may allow for automated surface mounting. By providing a flat or other surface, the clip 12 may be held with a vacuum, removed from a tape or reel, and deposited in the hole 18.

Figures 5, 6:
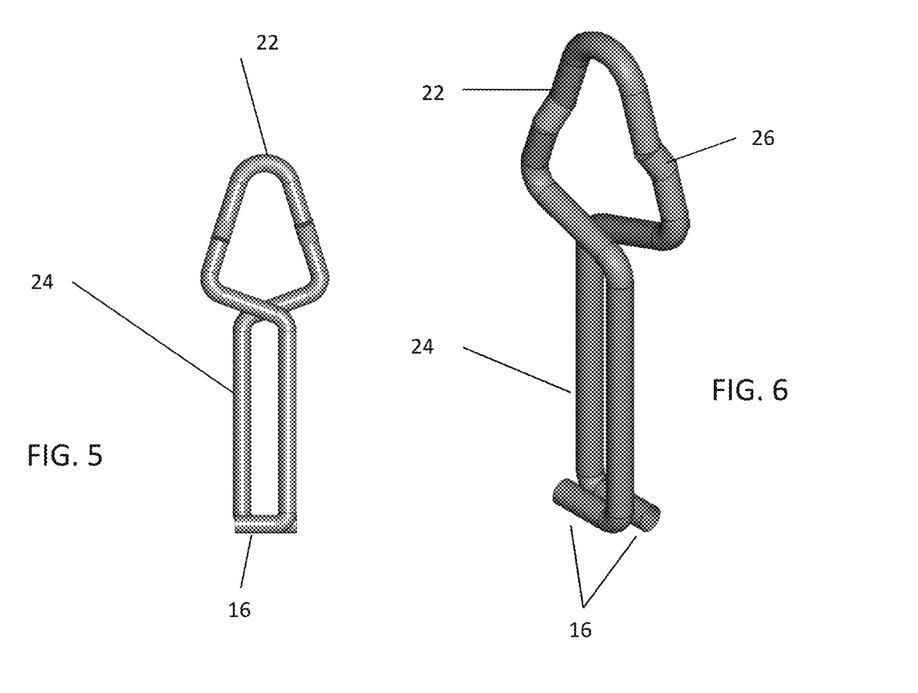
FIGS. 5 and 6 are a front view and perspective view, respectively, of the clip of FIG. 3 as compressed for insertion into a hole.

The body 22 lies in a same plane. In FIG. 4, the plane is horizontal across the drawing and perpendicular to the page. In FIG. 5, the plane is the plane of the page. The upper part of the body 22, all of the body 22, or other parts of the body 22 are spring like or hinged allowing compression and flexing back to a rest state or to a state resting against a blocking object (e.g., the hole 18). The compression on the loop 22 and/or against the prongs 24 slides at least part of the prongs 24 and the extensions 16 together (see FIGS. 5 and 6). Release of the compression causes the clip 12 to spring back to the position shown in FIG. 3 (rest position) or against the hole 18 as shown in FIGS. 1 and 4. In alternative embodiments, the body 22 extends out of the plane, such as having a bend or other structure for supporting a hook from the heat sink 14.

The prongs 24 extend from the body 22. The prongs 24 are of the same material as the body 22, but may be different material. Two prongs 24 are provided, but additional prongs 24 may be used. When the clip 12 is positioned in the hole 18, the prongs 24 extend through the hole 18, allowing the extensions 16 to be on one side of the printed circuit board 10 and the body 22 to be on the other side of the printed circuit board 10.

The prongs 24 include knees or bends 26. The bends 24 are positioned on the clip 12 so that the bends 26 are on an opposite side of the hole 18 (e.g., opposite side of the printed circuit board 10) than the extensions 16 when the clip 12 is positioned in the hole 18. In alternative embodiments, the bends 26 are on the body 22 as shown in FIGS. 5 and 6. In other embodiments, there are no bends 26, but instead the prongs 24 extend from the body 22 in an offset manner as shown in FIG. 8.

The bends 26 position one or both prongs 24 out of the plane of the body 22. The bends 26 provide an offset of the extensions 16 along the width dimension. For example, in the view of FIG. 4, the plane of the body 22 is orthogonal to the drawing sheet and along a horizontal line through the center of the length of the body 22. Each of the prongs 24 and resulting extensions 16 are offset from that plane (i.e., one extension 16 shifted up and another shifted down as shown in FIG. 4). Greater or lesser offset from the plane may be provided. In the example of FIG. 4, both prongs 24 include bends 26 to shift the two extensions 16. In other embodiments, the center of the length of one extension is in the same plane with the body 22 and the center of the length of the other extension 16 is parallel but outside of the plane.

The bends 26 or prong position relative to the body 22 is configured to offset the extensions 16 so that the extensions 16 may overlap. When the clip 12 is compressed, the extensions 16 move towards each other. Since the lengths of the extensions 16 are generally parallel but offset in different planes, the extensions 16 may move into an overlapping position without blocking each other. The prongs 24 and/or extensions 16 may touch or even be displaced as contact is made, but are not blocked as if the extensions were moving together in a same plane. The offset or distance between the planes of the extensions 16 is at least 80%, 90%, 100% or more of a width of the extensions 16.

FIGS. 5 and 6 show the extensions 16 in the overlap position. Due to compression and the prongs 24 being offset, the extensions 16 move along different planes so that the extensions 16 do not block each other. There is no blocking contact, but instead the extensions 16 slide along each other with only minor or no interference (e.g., friction or partial intersection). From the front view of FIG. 5, the extensions are shown completely overlapping. The length of each extension is given as 0.070 inches in this example. Due to the overlap when viewed from a direction perpendicular to the length of the extensions 16, the extensions 16 together require 0.070 inches of hole length for insert. More or less overlap may be provided, such as the two lengths of the extensions 16 overlapping by 75%, causing the summed length of the extensions 16 to be about 0.088.

The bends 26 cause a step in the prongs 24 to offset the extensions in a direction perpendicular to the longest extent of the hole 18. As a result, the overlap allows insertion into the smaller hole, such as shown in FIG. 2B. FIG. 4 shows a hole 18 with generally two rectangular shapes overlapping to form on hole 18. The overlapping of the extensions 16 allows insertion of the clip 12 into the hole 18. In either type of hole 18, the lengths of the extensions 16 as overlapped extend along the longest extent of the hole 18 by less than a sum of the lengths of the extensions (e.g., overlap of FIG. 5 providing length of 0.070 instead of the sum of 0.140). The overlap causes the combined length of the extensions 16 to be less than the longest extent of the hole 18 for insertion through the hole 18.

The extensions 16 extend from the prongs 24 for contacting a surface of the printed circuit board 10. The extensions 16 extend parallel to the plane of the body 22, but may extend in other directions as well or instead. The length of the extensions is more than half of the longest extent of the hole 18 (e.g., 0.070 inch length of the extension is more than have of the 0.080 inch longest extent of the hole 18). In one embodiment, the extensions are 0.070 inches or more, but may be less.

The extensions 16 are positionable adjacent to each other with overlap as viewed along a direction orthogonal to the plane of the body 22 and intersecting the extensions 16. In this overlapping position shown in FIGS. 5 and 6, the center of one or centers of both along the length (e.g., longest dimension) of the extensions 16 are out of the plane of the body 22, such as being offset on opposite sides of the plane. This allows the width and length of the extensions 16 together to pass through the smaller hole of FIG. 2B.

The extensions 16 are retainers. Once the clip 12 is positioned through the hole 18, the compression ceases and the clip 12 springs to put the prongs 24 in contact with the sides of the hole 18 or at least closer to the hole 18. As a result, the extensions 16 pass along the surface of the printed circuit board 10, resting adjacent to and/or in contact with the surface as shown in FIG. 1. When the body 22 is pulled away from the printed circuit board 10, the extensions 16 contact the surface of the printed circuit board 10. This contact holds the clip 12 to the printed circuit board 10, counteracting the pulling force. The extensions 16 retain the clip 12 in the hole 18. The offset of the prongs 24 of the clips 12 shown in FIG. 3 or 7 allow insertion into the smaller hole 18. Once inserted, spring force of the clip 12 or the prongs 24 cause the extensions 16 to be in a position relative to the hole 18 and the printed circuit board 10 to retain the clip 12 in place despite force pulling on the body 22 of the clip 12.

The heat sink 14 is a metal or other thermally conductive material. Any now known or later developed heat sink 14 may be used. In one embodiment, the heat sink 14 includes a contact block for placement adjacent to a heat generating component (e.g., chip) and fins for radiating heat to the atmosphere. A fan may or may not be included. In another embodiment, the heat sink 14 includes a block through which fluid channels pass. A pump may or may not be included.

The heat sink 14 includes one or more arms 20 (see dashed arm 20 in FIG. 1). The arms 20 are spring loaded or spring material. Alternatively, a lever or other mechanism is used to place tension on the arm 20. The arm 20 contacts the clip 12, such as having an end slide in the gap in the body 22. The arm 20 applies force to the clip 12 pulling the extensions 16 against the printed circuit board 10. The arm 20 applies forcing pulling the body 22 of the clip 12 away from the printed circuit board 10. The clip 12, due to the extensions 16 retaining the clip 12 in the hole, holds the heat sink 14 in place against or adjacent to the printed circuit board 10 (e.g., against a chip mounted on the printed circuit board 10). Other mounting arrangements using the clip 12 may be used.

Figure 9:
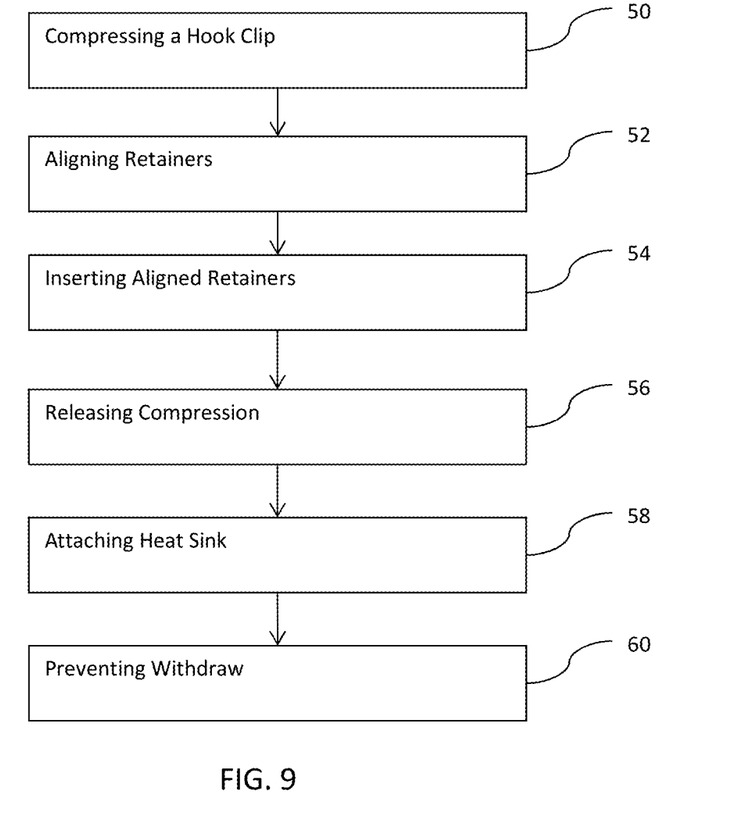
FIG. 9 is a flow chart diagram of one embodiment of a method for inserting a clip and retaining a component.

FIG. 9 shows a method for inserting and retaining a clip in a board. The clip is inserted to retain an object against a surface. The clip is one of the ones described above for FIGS. 1-8 or a different clip. Additional, different, or fewer acts may be provided. For example, act 58 and 60 are not provided. As another example, acts 58 and 60 are performed without the other acts.

In act 50, a hook clip is compressed. Spring metal or other material of the hook clip is pressed upon. The compression is manual by an installer or is automated. For example, application of a vacuum or mechanical force causes compression.

The compression is applied to a loop of the hook clip and/or to the legs extending from the loop. In alternative embodiments, the compression is applied to the feet of the legs. The compression is to compact the hook clip. The legs of the hook clip are made to approach closer to each other along paths of travel that are side-by-side without blocking each other. For example, the compression causes the clip 12 of FIG. 3 to deform into the position shown in FIG. 5.

In act 52, the retaining parts (e.g., feet) of the legs align in response to the compression. The retaining parts are positioned side-by-side each other by traveling along the paths of travel. The paths do not intersect or only slightly intersect (shallow angle), allowing the retaining parts to overlap or be next to each other along the lengths of the retaining parts instead just at the ends closest to each other on approach.

The alignment of the retaining parts causes the longest extent of the retaining parts together to be less than a sum of the longest extents of the retaining parts if blocking each other. Due to the side-by-side alignment, the length of the clip to be inserted into the hole is not defined by the sum of the lengths of the retaining parts, but instead is less due to the overlap. For example, the alignment shown in FIGS. 5 and 6 is provided.

In act 54, the retaining parts and part of the leg are inserted into the hole on the board. The retainer parts pass through the hole for placement on a backside of the board. This insertion is top down relative to the board.

The insertion is into a hole having a largest dimension less than the sum of the two lengths of the retaining parts. Due to the overlap, the length of the hole may be smaller. Due to the overlap, the width of the hole is greater than if the retaining parts stayed in a same plane. The reduction in length is greater than the increase in width, resulting in a smaller hole as measured by area or circumference.

The insertion is manual. A person compresses, aligns, and inserts the clip into the hole. Alternatively, an automated insertion may be provided. Using a pick and place or tape/reel and vacuum process, the clip is inserted into the hole. To avoid compressing the clip directly with the automated process, an insert in the hole may have a ramp structure. As the clip is pressed downward, the ramps guide the retainer parts against the spring force of the clip to overlap and pass through the hole. Any automated arrangement may be used.

In act 56, the compression is released. The manual or automated force compressing the clip ceases or stops. The pressing ceases.

In response to the release of compression, the retaining parts move apart. The spring force of the legs and/or loop of the clip cause the retaining parts to stop overlapping and move away from each other so that there is no overlap of the legs. Some overlap may remain. The retaining parts move away from the hole so as to be adjacent a surface of the board.

In act 58, a heat sink or other object is attached to the hook clip. The hook or loop portion of the clip connects with or makes contact with an arm or other part of the object. This contact or connection acts to hold the object in place. The hook clip counters force attempting to move the object away from the board.

In act 60, the withdraw of the hook clip through the hole in the board is prevented. The retaining parts, as positioned against the board surface, prevent removal of the hook clip. The retaining parts, if not already in contact, contact the board surface in response to force pulling on the loop. The board surface blocks withdraw of the retaining parts. This prevention holds the heat sink or other object in place.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. A system comprising:
    a printed circuit board having a hole, the hole having a longest extent on a surface of the printed circuit board;
    a clip held in the hole by feet of prongs of the clip, the feet being extensions each having a length that is more than half the longest extent of the hole; and
    a heat sink held, in part, relative to the printed circuit board by the clip, an arm of the heat sink contacting a loop of the clip and applying a force on the clip directed away from the printed circuit board, the feet of the clip on an opposite side of the printed circuit board than the heat sink and holding the clip to the printed circuit board to counteract the force;
    wherein the prongs offset the feet such that the extensions overlap with the lengths extending along the longest extent of the hole by less than a sum of the lengths of the feet and less than the longest extent for insertion through the hole and wherein the feet and corresponding extensions are in parallel planes with a plane of the loop.

2. The system of claim 1 wherein the longest extent of the hole is less than 0.090 inches and the extensions are each more than 0.070 inches.

3. The system of claim 1 wherein a width of the hole perpendicular to the longest extent is greater than a sum of widths of the feet of the prongs.

4. The system of claim 1 wherein the loop of the clip is a spring material where compression on the loop slides the extensions together and release of the compress allows the extensions to slide apart after insertion through the hole.

5. The system of claim 1 wherein the extensions are spaced apart while the clip is in the hole such that the extensions contact the printed circuit board.

6. The system of claim 1 wherein the prongs are two prongs, each of the prongs being partly through the hole and having bends on an opposite side of the hole than the feet, the bends providing the offset.

7. The system of claim 6 wherein the bends cause the prongs to avoid blocking contact of the feet during compression of the loop.

8. The system of claim 6 wherein the bends define a step in the prongs to cause the offset perpendicular to the longest extent of the hole.

9. The system of claim 8 wherein the step comprises a knee extending less than 10% of a length of the prong.

10. The system of claim 1 wherein the loop comprises a plastic cover.

11. The system of claim 1 wherein the feet are in a position having the overlap for insertion of the feet through the hole.

12. The system of claim 1 wherein the hole comprises two elongated portions offset along a width of the hole and along the longest extent.

* * * * *